United States Patent [19]

Davy et al.

[11] 3,876,822

[45] Apr. 8, 1975

[54] ELECTRICAL CONNECTION BOARD WITH CONDUCTORS FOR TRANSMITTING HIGH-FREQUENCY SIGNALS

[75] Inventors: Gerald Albert Davy; Bernard Louis Le Govic; Jean-Paul LaGrange; Jean-Claude Adrien Prouin; Jean Louis Sandoz, all of Paris, France

[73] Assignee: Compagnie Honeywell Bull (Societe Anonyme), Paris, France

[22] Filed: Dec. 21, 1973

[21] Appl. No.: 427,294

[30] Foreign Application Priority Data

Dec. 28, 1972 France .............................. 72.46681

[52] U.S. Cl. ........... 174/68.5; 29/625; 317/101 CM

[51] Int. Cl. ............................................ H05k 1/04

[58] Field of Search...174 68.5; 317/101 B, 101 CM, 317/101 D, 101 CW; 339/17 R, 18 C; 29/625

[56] References Cited

UNITED STATES PATENTS 3,564,114 2/1971 Blinder .................... 317/101 CM X

FOREIGN PATENTS OR APPLICATIONS 1,157,432 7/1969 United Kingdom ......... 317/101 CM

*Primary Examiner*—Darrell L. Clay
*Attorney, Agent, or Firm*—Ronald T. Reiling

[57] ABSTRACT

An electrical connection board containing a number of planes of conducting elements, with each pair of planes attached to the two faces of an insulating plate, arranged so that the conducting elements of one plane do not overlap those of other planes, with regularly spaced rows and columns of metallized connecting holes interposed therethrough. The conducting elements are capable of transmitting high-frequency pulses exhibiting steep edges without undesirable cross-talk phenomena resulting.

9 Claims, 6 Drawing Figures

ELECTRICAL CONNECTION BOARD WITH CONDUCTORS FOR TRANSMITTING HIGH-FREQUENCY SIGNALS

BACKGROUND OF THE INVENTION

1. Field of the Invention

The present invention relates to an electrical connection board intended more particularly for the construction of electronic data processing equipment.

2. Description of the Prior Art

In construction techniques for equipment intended for data processing, large use is made of compact circuits which enable the dimensions of such equipment to be reduced considerably. These compact circuits are often built in the form of printed circuits which sometimes are assembled in several layers in electrical connection boards, and also in removable cards which may or may not be furnished with electronic components, these cards being pluggable into connectors mounted on the connection boards.

Given that very many electrical connections are provided by each of these interconnection boards, the printed circuits borne by a single board have had to be distributed in two or more layers, the electrical connections between these different layers of circuits being formed by means of metallized holes cut through the entire thickness of the board, these metallized holes also being used for the plugging in and solder connection of contact pieces mounted in the connectors.

Although these connection boards are entirely satisfactory when used in logic circuits or switching circuits operating at relatively low repetition frequencies, i.e. on the order of a few hundred kilohertz, they are no longer suitable when their conductors are to be traversed by very-high-frequency signals comprising very steep edges. In fact, in that event, as a result of the small spacing between the conductors of one layer of printed circuits or the small thickness of the insulating layer separating two adjoining layers of circuits, it very often happens that parasitic inductive couplings are produced, which then cause the appearance of particularly troublesome parasitic signals.

To remedy this drawback, connection boards have been proposed in which the metallized holes are distributed in regularly spaced rows and columns, the conductors of one of the layers of circuits being arranged parallel to one another along the direction of these rows of metallized holes, whereas, in an adjoining layer of circuits, the conductors are oriented transversely to these rows. A connection board of this type has been described and illustrated in French Pat. No. 2,067,825. However, these connection boards are poorly shaped for forming the necessary interconnections between the conductors used to plug in the printed circuit cards. In fact, because these connectors are generally arranged on a board along the direction transverse to the rows of metallized holes, the electrical connections between these connectors must be provided essentially by the board conductors that are parallel to these rows. These electrical connections are all the more difficult to effect because the contact pieces in each connector are numerous and very close to one another and, since the density of conductors parallel to the rows is therefore relatively high, it becomes practically impossible to eliminate crosstalk phenomena.

OBJECT OF THE INVENTION

It is an object of the present invention to remedy the drawbacks of the prior art by providing a connection board whose conductors are capable of transmitting high-frequency pulses exhibiting very steep edges without this resulting in undesirable crosstalk phenomena.

SUMMARY OF THE INVENTION

One embodiment of the invention concerns an electrical connection board comprising at least two planes of conductors attached respectively to the two faces of an insulating plate and interconnected by metallized holes traversing said plate, these metallized holes being arranged along regularly spaced rows and columns, each conductor extending essentially in the direction of said rows over a surface area comprised between two consecutive rows of metallized holes, said board being characterized in that each of the conductors attached to one of the faces of the plate has the form of a bent line whose $(1 + 4k)^{th}$ segments ($k$ assuming the values of successive integers) are arranged along the median line of the two rows of metallized holes bordering the portion of surface area over which this conductor extends, these segments coinciding with the parts of this line that are disposed between the $2n^{th}$ and the $(2n + 1)^{th}$ columns of holes ($n$ assuming the values of successive integers), and whose $(3 + 4k)^{th}$ segments are arranged along one and/or the other of these rows and along the parts of these rows disposed between the $(2n + 1)^{th}$ and the $(2n + 2)^{th}$ columns, and characterized in that the conductors attached to the other face of the plate have a form identical to that of the conductors of the first face, but are positioned with respect to them in a manner such that their segments placed along the median lines of the rows of holes alternate with those of the conductors of the first face.

BRIEF DESCRIPTION OF THE DRAWINGS

Other characteristics and advantages of the invention shall become evident in the following description, provided by way of nonrestrictive example, with reference to the appended drawings which show.

DESCRIPTION OF THE PREFERRED EMBODIMENT

Figure 1:
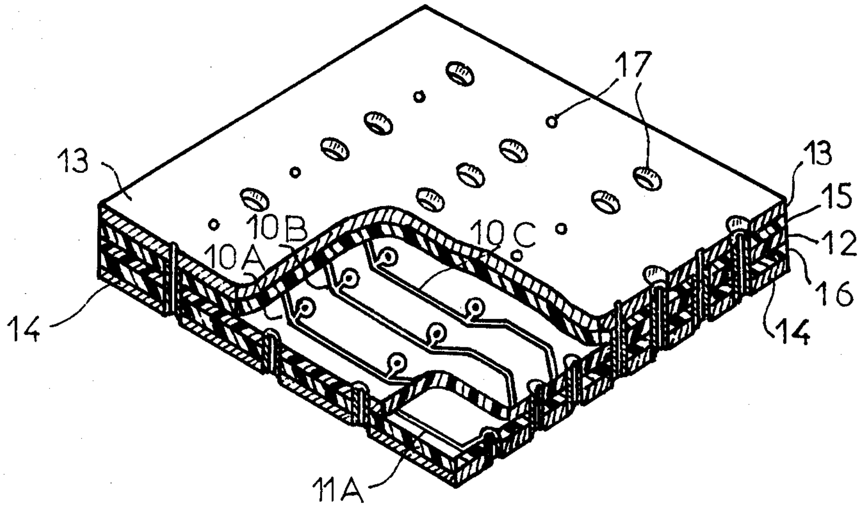
FIG. 1, a perspective view, with portions extracted, of a portion of a connection board built according to the invention.
Figure 2:
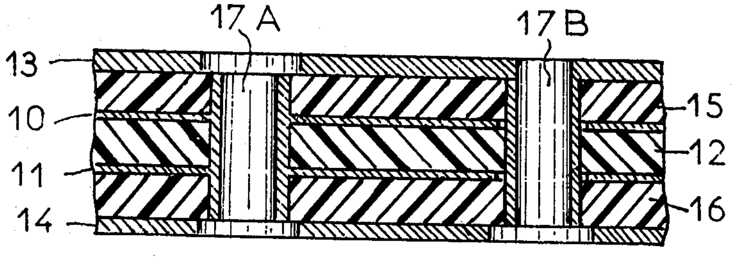
FIG. 2, a sectional view of the board of FIG. 1 in a zone comprising two metallized holes permitting the interconnections of layers.

The connection board illustrated in FIGS. 1 and 2 essentially comprises two planes 10 and 11 of printed conductors, these two planes being separated from one another by a layer 12 of insulating material. The plane 10 comprises a plurality of conductors of which only some, references 10A, 10B and 10C, are visible in FIG. 1. Likewise, the plane 11 comprises a plurality of conductors of which a single one, reference 11A, is shown partially in FIG. 1. The connection board illustrated in FIGS. 1 and 2 further comprises two continuous conducting layers 13 and 14 arranged on both sides of the system formed by the planes 10 and 11 and the layer 12 and separated from this system by two layers 15 and 16 made of insulating material. Metallized holes cut through the entire thickness of the board make it possible either to electrically connect certain conductors of planes 10 and 11 between one another, or to connect these conductors or the continuous layers 13 and 14 to contact pieces of connectors mounted on the connection board. Thus, for example, FIG. 2 shows a metallized hole 17A effecting the interconnection of conductors of planes 10 and 11, and a metallized hole 17B connected only to the conducting layer 13.

Figure 3:
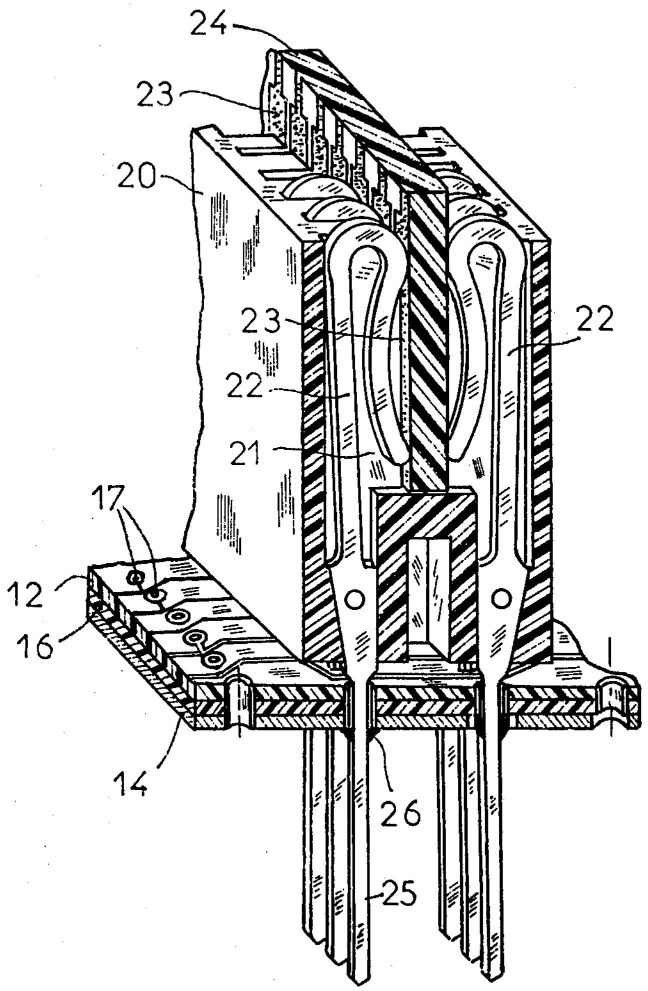
FIG. 3, a sectional view of a connection board built according to the invention, equipped with a connector for printed-circuit cards.

Contact pieces of connectors for printed circuit cards can be plugged and connected by solder in the metallized holes 17. One of these connectors is illustrated by way of example in FIG. 3. The connector, which is shown in partial section in this Figure, has been described in French Pat. No. 1,541,094. We recall that this connector comprises an insulating member 20 furnished with interior cavities 21 adapted to accept contact pieces 22 arranged to enter into contact with contact zones 23 formed on the opposite faces of one end of a printed circuit board 24 engaged in the connector. Each contact piece has a contact tail 25 arranged to pass into a metallized hole of the connection board.

The contact tails of the contact pieces can be connected by solder points 26 to the metallic parts plated on the walls of the holes 17. In the event that connections ought not to be effected between the continuous conducting layers 13 and 14 and certain contact tails, the metallized holes in which these tails are engaged are formed, in the example described, in a manner such that their diameter is larger at the level of these continuous layers than in the result of the crossing of the board, as can be observed for the metallized holes of FIG. 2. Known means such as, for example, the use of insulating rings or the engraving of conducting layers around the metallized holes can also be used to prevent the formation of undesirable connections between these contact tails and the continuous conducting layers during soldering operations.

In the embodiment illustrated in FIGS. 1 and 2, the continuous conducting layers 13 and 14 are normally connected to a voltage source (not illustrated) for the purpose of supplying, by means of contact pieces connected to these layers, two logic voltage levels (+5 volts and 0 volts) to the various electronic circuits borne by the printed circuit cards engaged in the connectors. In contrast, the conductors 10A, 10B, . . . . , 11A, etc. of planes 10 and 11 provide for the transmission of electric signals and pulses that are received or supplied by these electronic circuits. However, it should be noted that, although these conductors are distributed in two planes in the embodiment illustrated in FIGS. 1 and 2, the number of conductors of the connection board forming the object of the invention can, according to the instances of application, be different and be equal, for example, to three, four or more without, however, being less than two. Likewise, the conducting layers of this board can be variable in number. Thus, the connection board illustrated in FIG. 3 comprises only a single conducting layer 14 designed to supply a voltage of 0 volts to the contact pieces that have been connected to this layer. The connection board forming the object of the present invention can also comprise no continuous conducting layer and can even be reduced to a single insulating plate 12 bearing on its two faces a plurality of conductors 10A, 10B, . . . . , 11A, etc., which can be connected to one another by metallized holes 17.

Figure 4:
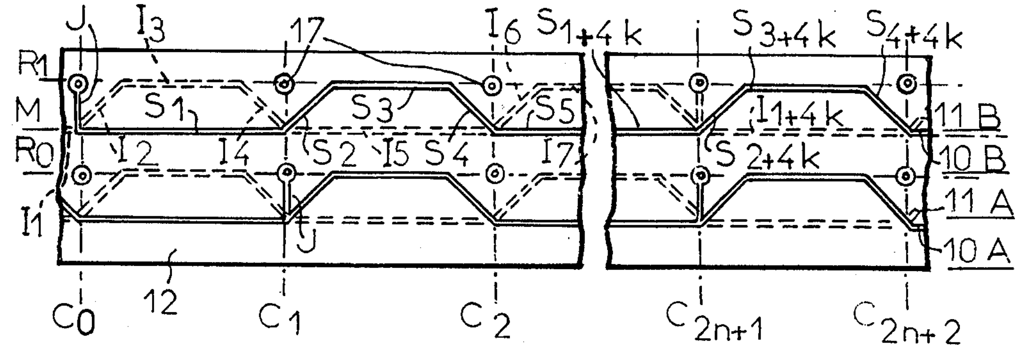
FIG. 4, a view showing a first arrangement of conductors in a connection board built according to the invention.
Figure 5:
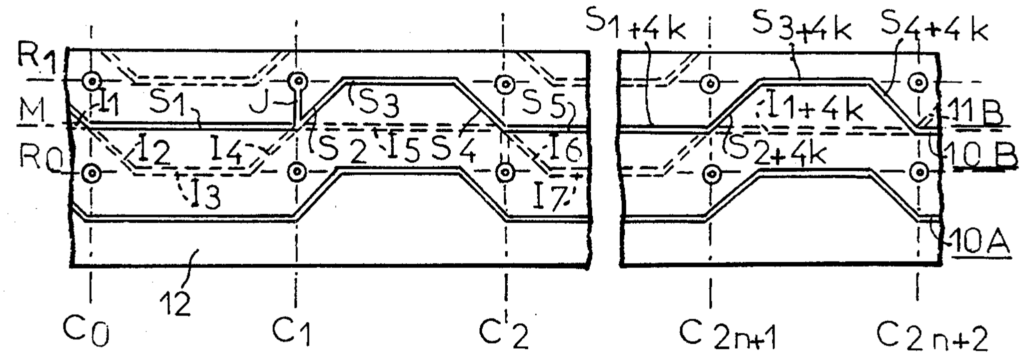
FIG. 5, a view showing a second arrangement of conductors in a connection board built according to the invention.
Figure 6:
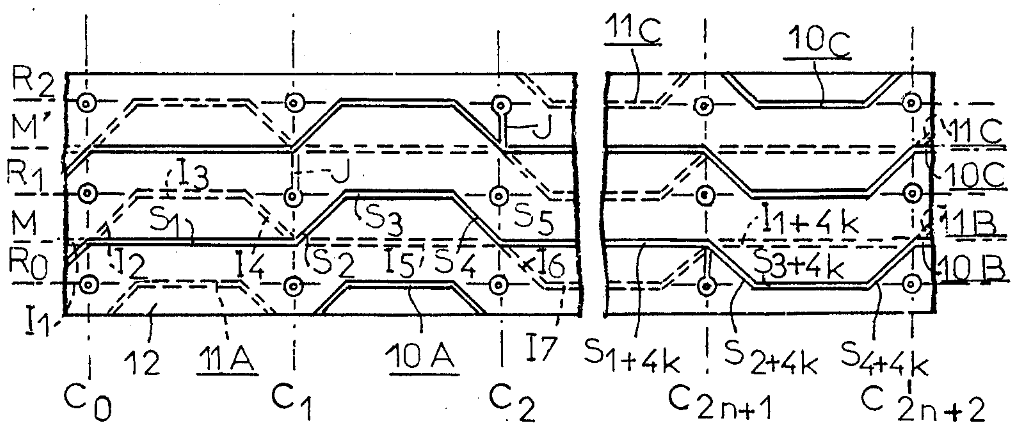
FIG. 6, a view showing a third arrangement of conductors in a connection board built according to the invention.

As can be seen in FIGS. 1, 3, 4, 5 and 6, the metallized holes 17 of the connection board are arranged along regularly spaced rows and columns, these columns being designed by $C_0$, $C_1$, $C_2$, . . . . $C_{2n}$, $C_{2n+1}$, etc. in FIGS. 4, 5 and 6. FIGS. 4, 5, and 6 are intended to indicate the shape and the different respective positions of the conductors of planes 10 and 11 of the connection board illustrated in FIG. 1. It will be observed that, in these Figures, these conductors are arranged on each of the faces of an insulating plate 12. FIGS. 4 and 5 show only two rows, denoted $R_0$ and $R_1$, of metallized holes, while three rows of metallized holes, denoted $R_0$, $R_1$ and $R_2$, have been illustrated in FIG. 6.

In FIGS. 4 to 6, the conductors of plane 10, i.e. 10A, 10B, 10C, etc., have been illustrated in solid lines, while those of plane 11, i.e. 11A, 11B, 11C, etc., have been indicated by broken lines. As shown in FIGS. 4 to 6, each of these conductors has a path which extends essentially in the direction of the rows of metallized holes, each conductor remaining localized, in the course of its development on the surface of the insulating layer 12, to a portion of surface area comprised between two consecutive rows of metallized holes. Thus, for example, the conductor 10B in FIG. 6 is comprised between the rows $R_0$ and $R_1$ of metallized holes. FIGS. 4 to 6 show that each of these conductors has the shape of a bent line consisting of segments denoted $S_1$, $S_2$, $S_3$, $S_4$, etc. for the conductors of plane 10, and $I_1$, $I_2$, $I_3$, $I_4$, etc. for the conductors of planes 11, the segments of odd index, i.e. $S_1$, $S_3$, $S_5$, etc., or $I_1$, $I_3$, $I_5$, etc., being parallel to the rows of metallized holes. As can be seen in these Figures, the segments $S_1$, $S_5$, . . . , $S_{1+4k}$, . . . or $I_1$, $I_5$, . . . , $I_{1+4k}$, . . . . of one conductor, i.e. generally the $(1+4k)^{th}$ segments, $k$ assuming successively the integral values 0, 1, 2, 3, 4, etc., are arranged along the median line of the two rows of metallized holes that border the portion of surface area on which this conductor is situated. Thus, for example, the $(1+4k)^{th}$ segments of conductor 10B in FIG. 4, i.e. the segments $S_1$, $S_5$, $S_9$, $S_{13}$, . . . . , $S_{1+4k}$, . . . . of this conductor ($S_9$ and $S_{13}$ not being illustrated in this Figure for reasons of simplification), are arranged along the median line M of rows $R_0$ and $R_1$ of metallized holes. In contrast, the segments, $S_3$, $S_7$, $S_{11}$, . . . , $S_{3+4k}$, . . . or $I_3$, $I_7$, . . . , $I_{3+4k}$, . . . of one conductor, i.e. generally the $(3+4k)^{th}$ segments, $k$ varying by successive integral values, are arranged along the rows of metallized holes. Thus, for example, the $(3+4k)^{th}$ segments of conductor 11B in FIG. 4, i.e. the segments $I_3$, $I_7$, . . . , $I_{3+4k}$, . . . of this conductor, are arranged along the row $R_1$ of metallized holes.

As can be seen in FIGS. 4 to 6, all the segments $S_1$ of the conductors of plane 10 are comprised between the columns $C_0$ and $C_1$ of metallized holes. Likewise, all the segments $S_5$ of these conductors are comprised between the columns $C_2$ and $C_3$ (not illustrated) of metallized holes. Generally, all the segments of general index $1+4k$ of the conductors of plane 10 ($S_1$, $S_5$, etc.) are comprised between the two columns of metallized holes whose indices are $2n$ and $2n+1$, respectively, $n$ varying by integral values. In contrast, all the segments of the conductors of plane 11 are arranged along the median lines of the rows of holes, i.e. all the segments of general index $1+4k$ of the conductors of plane 11 ($I_1$, $I_5$, etc.), are comprised between the two columns of metallized holes whose general indices are $2n+1$ and $2n+2$, respectively. Thus, for example, all the segments $I_3$ are comprised between the two columns $C_1$ and $C_2$. If we now consider the segments that are arranged along the rows of metallized holes, we see that the segments of general index $3+4k$ of the conductors of plane 10 ($S_3$, $S_7$, etc.) are comprised between the two columns of metallized holes whose general indices are $2n+1$ and $2n+2$, respectively, while the segments of general index $3+4k$ of the conductors of plane 11 ($I_3$, $I_7$, etc.) are comprised between the 2 columns of metallized holes whose general indices are $2n$ and $2n+1$, respectively. Owing to this alternation in the arrangement of their segments, the conductors that are arranged on one of the faces of the insulating plate 12, i.e. those of plane 10 for example, do not overlap those that are arranged on the other face, so that, if signals exhibiting very steep edges traverse a conductor arranged between two rows of holes on one of the faces of plate 12 at a relatively high repetition frequency, practically no induced parasitic signals appear in the conductor which, on the other face of the plate, is arranged between these same rows of metallized holes.

FIGS. 4 to 6 show further that the length of each of the segments $S_1, S_5, \ldots, S_{1+4k}, \ldots, I_1, I_5, \ldots, I_{1+4k}$, which are arranged along the median lines of the rows of metallized holes, is practically equal to the distance that separates two consecutive columns of metallized holes, while that of the segments $S_3, S_7, \ldots, S_{3+4k}, \ldots, I_3, I_7, \ldots, I_{3+4k}, \ldots$ which are arranged along the rows of metallized holes is less than this distance. For that reason, the segments of even index such as $S_2$, $S_4$, $\ldots$, $I_2$, $I_4$, $\ldots$, are oriented obliquely with respect to the rows of holes and form an angle different from 90° with these latter. In the example described, this angle is practically equal to 45°. Due to this configuration, it can then be understood that each conductor of plane 10 or of plane 11 never passes through a metallized hole in the course of its path over the insulating plate 12. However, the connections required between these conductors and certain metallized holes are effected by means of junction conductors which, supported by the plate 12, are arranged along the columns of metallized holes, these junction conductors being designated by the reference J in FIGS. 4 to 6.

The conductors of planes 10 and 11 of the connection board forming the object of the invention can assume various configurations, some examples of which have been illustrated in FIGS. 4 to 6.

In the embodiment illustrated in FIG. 4, the $(3+4k)^{th}$ segments of a conductor extending over one of the faces of the plate 12 between two rows of metallized holes, as well as those of the conductor which extends between these same rows on the other face of this plate, are always arranged along the same row of metallized holes. For example, if we consider the conductors 10B and 11B of FIG. 4 which extend between the rows $R_0$ and $R_1$ of metallized holes on each of the faces of plate 12, we see that the segments $S_3$, $S_7$, etc. of conductor 10B and the segments $I_3$, $I_7$, etc. of conductor 11B are all arranged along the row $R_1$.

If we now refer to FIG. 5, we see that the $(3+4k)^{th}$ segments of a conductor extending over one of the faces of the plate 12 between two rows of metallized holes are always arranged along one of these rows, while the segments of the conductor that extends over the other face of this plate between these same rows are always arranged along the other row. For example, if we consider the conductors 10B and 11B in FIG. 5 which extend between the rows $R_0$ and $R_1$ of metallized holes, we see that the segments $S_3$, $S_7$, etc. of conductor 10B are all arranged along the row $R_1$, while the segments $I_3$, $I_7$, etc. of conductor 11B are all arranged along row $R_0$.

Finally, referring to FIG. 6, we see that the $(3+4k)^{th}$ segments of a conductor extending over one of the faces of plate 12 between two rows of metallized holes are arranged alternately, some along one of these rows and some along the other. In this instance, the $(3+4k)^{th}$ segments of the conductor, which on the other face of the plate extends between these same rows, are arranged so as to never overlap those of the preceding conductor.

It can be noted that, whenever the configuration adopted, the conductors that are arranged over one of the faces of the insulating plate 12 have a shape identical to that of the conductors that are arranged over the other face of this plate, and that the segments of the conductors of one face are never superposed over those of the conductors of the other face. It should be noted that, although the thickness of this plate is relatively small, i.e. on the order of one to two millimeters in the example described, these conductors are capable of transmitting pulses exhibiting very steep edges at a high frequency which can be up to 2 megahertz, without creating undesirable crosstalk phenomena.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. Electrical connection board comprising two planes containing conductors attached respectively to the two faces of an insulating plate and interconnected by metallized holes traversing said plate, said metallized holes being arranged along regularly spaced rows and columns, each conductor extending essentially in the direction of said rows over a surface area comprised between two consecutive rows of metallized holes, said board being characterized in that each of the conductors attached to one of the faces of the plate has the form of a bent line whose $(1+4k)^{th}$ segments ($k$ successively assuming the values of zero and positive integers) are arranged along the median line of the two rows of metallized holes bordering the portion of surface area over which this conductor extends, said segments coinciding with the parts of this line that are disposed between the $2k^{th}$ and the $(2k+1)^{th}$ columns of holes, whose $(3+4k)^{th}$ segments are arranged along one of these rows and along the parts of these rows disposed between the $(2k+1)^{th}$ and the $(2k+2)^{th}$ columns, and whose $(2+4k)^{th}$ and $(4+4k)^{th}$ segments of each conductor are arranged obliquely with respect to the rows of metallized holes, and characterized in that the conductors attached to the other face of the plate have a form identical to that of the conductors on the first face, but are positioned with respect to them with their odd-numbered segments placed along alternate median lines of rows of holes and along alternate rows of holes than those of the conductors of the first face.

2. Electrical connection board according to claim 1, characterized in that the conductors attached to the two faces of the insulating plate have a configuration in which the $(3+4k)^{th}$ segments of a conductor which extends over one of the faces of the plate between two consecutive rows of metallized holes, as well as the $(3+4k)^{th}$ segments of the conductor which extends over the other face of the plate between these same rows, are all arranged along one of these two rows.

3. Electrical connection board according to claim 1, characterized in that the conductors attached to the two faces of the insulating plate have a configuration in which the $(3+4k)^{th}$ segments of a conductor which extends over one of the faces of the plate between two consecutive rows of metallized holes are arranged along one of these two rows, while the $(3+4k)^{th}$ segments of the conductor which extends over the other face of the plate between these same rows are arranged along the other row.

4. Electrical connection board according to claim 1, characterized in that the conductors attached to the two faces of the insulating plate have a configuration in which the $(3+4k)^{th}$ segments of a conductor which extends over one of the faces of the plate between the two consecutive rows of metallized holes, as well as the $(3+4k)^{th}$ segments of the conductor which extends over the other face of the plate between these same rows, are arranged alternately, some along one of these rows and some along the other, the arrangement being such that none of the $(3+4k)^{th}$ segments of the first conductor is superposed over any of the $(3+4k)^{th}$ segments of the second conductor.

5. Electrical connection board according to claim 1, characterized in that each of the $(3+4k)^{th}$ segments has a length less than the distance separating two consecutive columns of metallized holes, and the $(2+4k)^{th}$ and $(4+4k)^{th}$ segments of each conductor are therefore arranged obliquely with respect to the rows of metallized holes, the insulating plate being further provided on each of its faces with junction conductors arranged along the columns of holes, each junction conductor connecting a metallized hole of the plate to a conductor passing nearby said hole.

6. Electrical connection board according to claim 1 comprising a plurality of planes of conductors, with each pair of planes attached respectively to the two faces of an insulating plate, said conductors positioned in a manner such that their segments placed along the median lines of the rows of holes on a given plane alternate with those of the conductors of each adjacent plane.

7. Electrical connection board according to claim 6, characterized in that it further comprises a second continuous conducting plate arranged over the other face of the system of planes of conductors, this plate being separated from the system by a layer of insulating material.

8. Electrical connection board according to claim 1, characterized in that it further comprises a continuous conducting plate arranged over one of the faces of the system of planes of conductors, this plate being separated from said system by a layer of insulating material.

9. Electrical connection board comprising:

a plurality of planes containing conductors, with each pair of planes attached respectively to the two faces of an insulating plate and interconnected by metallized holes traversing said plate, said metallized holes being arranged along regularly spaced rows and columns, each conductor extending essentially in the direction of said rows over a surface area comprised between two consecutive rows of metallized holes, said board being characterized in that each of the conductors attached to one of the faces of the plate has the form of a bent line whose $(1+4k)^{th}$ segments ($k$ successively assuming the values of zero and positive integers) are arranged along the median line of the two rows of metallized holes bordering the portion of surface area over which this conductor extends, said segments coinciding with the parts of this line that are disposed between the $2k^{th}$ and the $(2k+1)^{th}$ columns of holes and whose $(3+4k)^{th}$ segments are arranged along one of these rows and along the parts of these rows disposed between the $(2k+1)^{th}$ and the $(2k+2)^{th}$ columns, and characterized in that the conductors attached to a given plane have a form identical to that of the conductors on each adjacent plane, but are positioned with respect to them with their odd-numbered segments placed along the alternate median lines of the rows of holes and along the alternate rows of holes than those of the conductors of each adjacent plane;

a plurality of junction conductors arranged along each column of holes on each face of each insulating plate, with each junction conductor connecting a metallized hole of the plate to a conductor passing nearby said hole;

two continuous conducting surfaces arranged over each of the faces of the system of planes of conductors, with each conducting surface being separated from said system by a layer of insulating material; and, said conductors characterized in that each of the $(3+4k)^{th}$ segments has a length less than the distance separating two consecutive columns of metallized holes, and the $(2+4k)^{th}$ and $(4+4k)^{th}$ segments of each conductor being arranged obliquely with respect to the rows of metallized holes.

* * * * *